United States Patent
Chu et al.

(10) Patent No.: US 7,465,995 B2
(45) Date of Patent: Dec. 16, 2008

(54) RESISTOR STRUCTURE FOR ESD PROTECTION CIRCUITS

(75) Inventors: Yu-Hung Chu, Guansi Township, Hsinchu County (TW); Shao-Chuang Huang, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 170 days.

(21) Appl. No.: 11/328,690

(22) Filed: Jan. 10, 2006

(65) Prior Publication Data

US 2007/0158748 A1 Jul. 12, 2007

(51) Int. Cl.
*H01L 23/62* (2006.01)

(52) U.S. Cl. .................. 257/361; 257/355; 257/356; 257/362; 257/363; 257/E27.035

(58) Field of Classification Search ................ 257/361, 257/362, 363, E27.035, 173
See application file for complete search history.

(56) References Cited

U.S. PATENT DOCUMENTS

| | | | |
|---|---|---|---|
| 6,096,609 A | | 8/2000 | Kim et al. .................... 438/281 |
| 6,137,664 A | * | 10/2000 | Casper et al. ................. 361/56 |
| 6,531,745 B1 | * | 3/2003 | Woolery et al. ............. 257/363 |
| 7,012,305 B2 | * | 3/2006 | Su et al. ...................... 257/355 |
| 2004/0256681 A1 | * | 12/2004 | Irino ........................... 257/384 |

* cited by examiner

*Primary Examiner*—David Vu
*Assistant Examiner*—Earl N Taylor
(74) *Attorney, Agent, or Firm*—K & L Gates LLP

(57) ABSTRACT

A semiconductor device includes an ESD protection device on a substrate, and a resistor having a gate structure overlying a resistor well separating a first doped region coupled to the ESD protection device and a second doped region coupled to a supply voltage for passing an ESD current from the second doped region to the first doped region to turn on the ESD protection device for dissipating the ESD current during an ESD event. The resistor well has an impurity density lower than that of the first and second doped regions for increasing resistance therebetween.

8 Claims, 3 Drawing Sheets

RESISTOR STRUCTURE FOR ESD PROTECTION CIRCUITS

BACKGROUND

The present invention relates generally to an integrated circuit (IC) design, and more particularly to a resistor structure for an electrostatic (ESD) protection circuit.

As semiconductor devices continue to shrink in size, their susceptibility to ESD damage is a growing concern for IC designs. An ESD event occurs when, for example, an object containing electric-static charges touches one or more pins of an IC. While the ESD event typically lasts for a very short period of time, the resulting voltage can reach thousands of volts and damage the vulnerable parts of semiconductor devices, such as the gate dielectric layers. In order to protect the semiconductor devices from the ESD damages, one or ESD protection circuits are often implemented at the pins of the IC for dissipating the ESD current as soon as the ESD event occurs. In a normal operation, the ESD protection circuit is turned off so that it does not interfere the functioning of the core circuit that it protects. During the ESD event, the ESD protection circuit is turned on to create a current path for dissipating the ESD current, thereby protecting the devices in the core circuit from damage.

One conventional ESD protection circuit is configured by a grounded-gate NMOS (GGNMOS) transistor coupled with a resistor, which is typically formed by continuous N-type doped region with one end coupled to a supply voltage and another coupled to the GGNMOS transistor. During the ESD event, the resistor passes the ESD current to turn on the GGNMOS transistor, thereby creating a current path for dissipating the ESD current.

Conventionally, an additional resistance protective oxide (RPO) layer is provided on top of the N-type doped region in order to avoid the formation of a silicide layer thereon during its fabrication process. Otherwise, the silicide layer would have directly coupled the GGNMOS transistor to the supply voltage, and caused a direct punch through for its underlying poly-silicon layer.

One drawback of such conventional ESD protection circuit is that the usage of the RPO layer complicates its fabrication process, thereby increasing the costs. Since the process of forming the RPO layer cannot be integrated in the process of constructing the GGNMOS transistor, a mask in addition to the ones for constructing the transistor is therefore required.

Another drawback of the conventional ESD protection circuit is that the resistor occupies a relatively large area in an IC. Conventionally, the N-type doped region of the resistor and the source/drain regions of the GGNMOS transistor are formed simultaneously. The impurity density of the N-type doped region is therefore as high as that of the source/drain regions of the GGNMOS transistor. Due to the high impurity density, the N-type doped region needs to occupy a large area in order to achieve a certain desired resistance.

It is therefore desirable to improve the resistor structure for the ESD protection circuit in order to simplify its fabrication process and reduce its size.

SUMMARY

The present invention discloses a semiconductor device for protecting a core circuit against ESD current. In one embodiment, the semiconductor device includes an ESD protection device on a substrate, and a resistor having a gate structure overlying a resistor well separating a first doped region coupled to the ESD protection device and a second doped region coupled to a supply voltage for passing an ESD current from the second doped region to the first doped region to turn on the ESD protection device for dissipating the ESD current during an ESD event. The resistor well has an impurity density lower than that of the first and second doped regions for increasing resistance therebetween.

The construction and method of operation of the invention, however, together with additional objectives and advantages thereof will be best understood from the following description of specific embodiments when read in connection with the accompanying drawings.

DESCRIPTION

Figure 1:
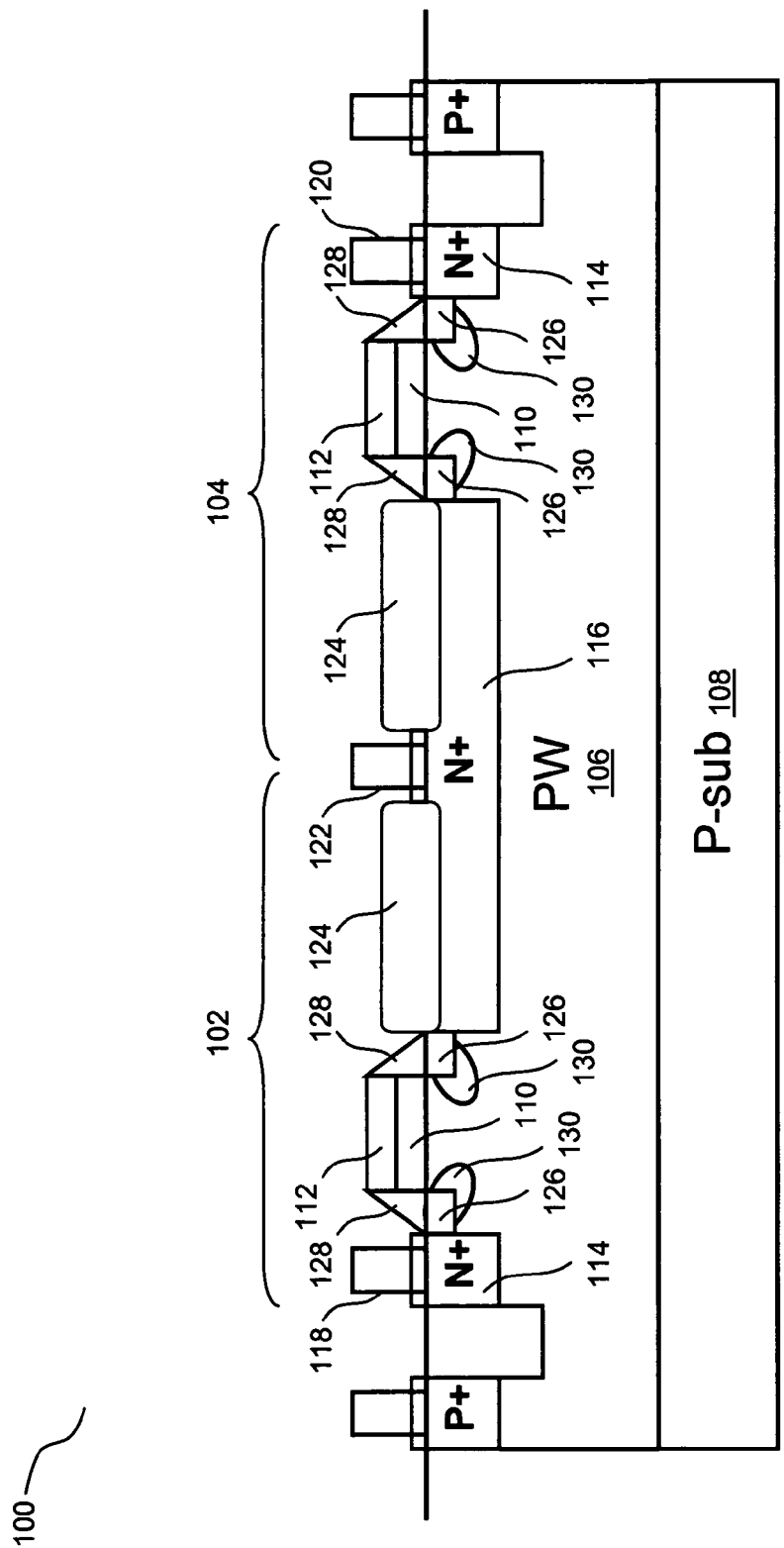
FIG. 1 illustrates a cross-sectional view of a conventional ESD protection circuit.

FIG. 1 illustrates a cross-sectional view of a conventional ESD protection circuit 100, which includes two conventional NMOS transistors 102 and 104 with resistance protection oxide (RPO) layers 124 fabricated as silicide masks on the drains of the transistors 102 and 104. The NMOS transistors 102 and 104 are used as ESD protection transistors and are in parallel for higher ESD protection capability. Both the NMOS transistors 102 and 104 are formed on a P-type well 106 which is formed in a P-type substrate 108. Each of the NMOS transistors 102 and 104 includes a gate dielectric layer 110, a gate conductive layer 112, a heavily doped N+ source 114, and a heavily doped N+ drain 116. A set of contacts 118 and 120 are formed on both heavily doped N+ sources 114, while a contact 122 is constructed on the heavily doped N+ drain 116. The RPO layers 124 are formed on the heavily doped N+ drain 116 at the both sides of the contact 122. During a silicide process in fabricating the ESD protection circuit 100, the RPO layers 124 prevent the heavily doped N+ drain 116 from being coated by a silicide layer.

A set of lightly doping drains (LDDs) 126 are formed at both sides of the gate dielectric layers 110 of both the NMOS transistors 102 and 104. A set of pocket implant regions 130 are formed adjacent to the LDDs 126 in the P-type well 106 for adjusting the electrical characteristics of NMOS transistors 102 and 104. The widths of the LDDs 126 are defined by using a set of sidewall spacers 128 attached to the sides of the gate dielectric layers 110 and the gate conductive layers 112. A first ion implantation process is performed to forms the LDDs 126 in alignment with the gate dielectric layer 110, while a second ion implantation process is performed to form the heavily doped N+ sources 114 and drain 116 in alignment with the sidewall spacers 128.

In a normal operation, the NMOS transistors 102 and 104 are turned off, so that they would not interfere the functioning of the core circuit they seeks to protect. During an ESD event, the ESD current would flow from the contact 122 through the N+ drain 116 to trigger on the NMOS transistor 102 or 104, or both, for dissipating the ESD current.

As discussed above, since the process of forming the PRO layers 124 cannot be integrated in the process of constructing the NMOS transistors 102 and 104, an extra mask is therefore require. Moreover, due to the high impurity density of the N+ drain, it needs to occupy a large area in order to achieve a certain desired resistance.

Figure 2:
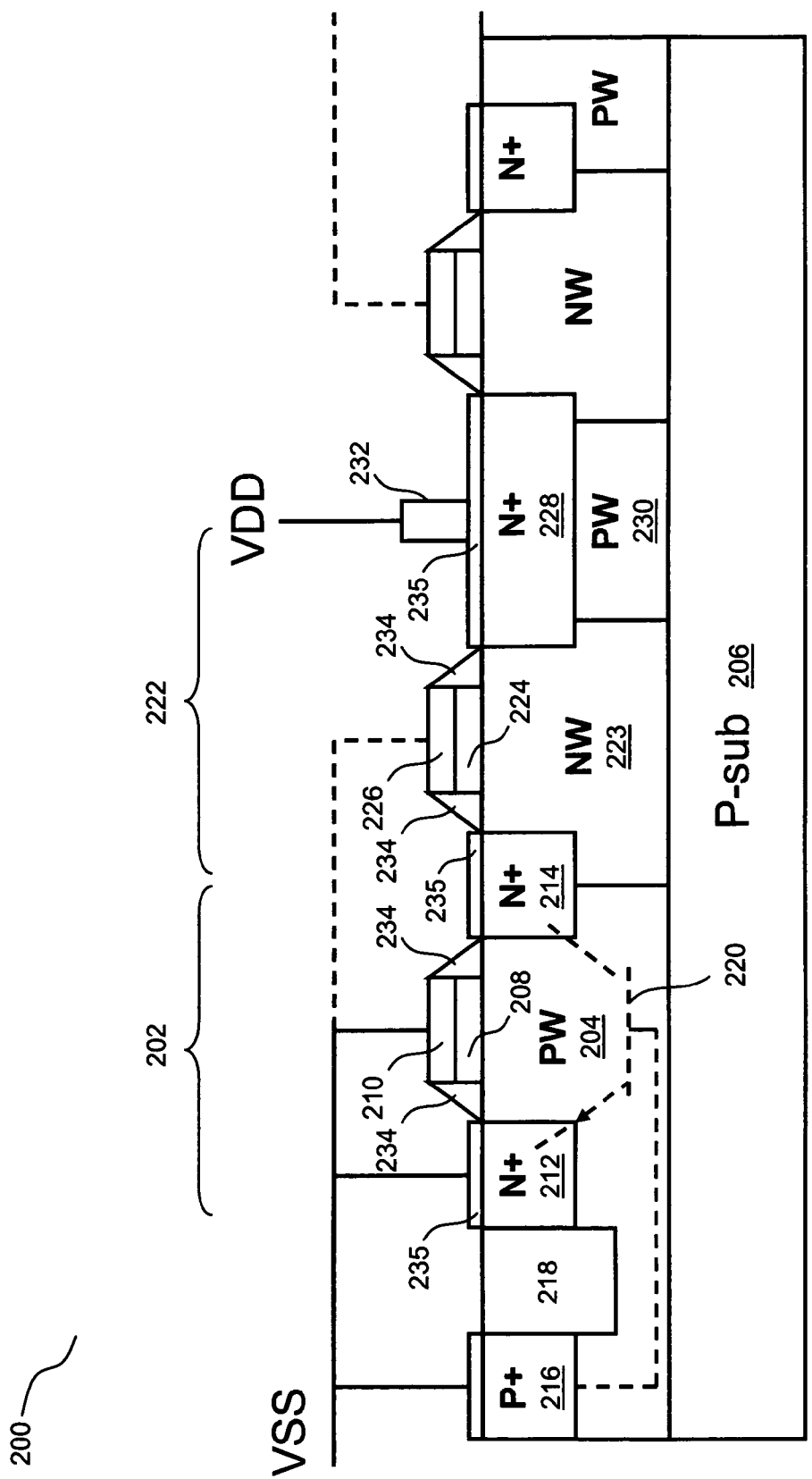
FIG. 2 illustrates a cross-sectional view of an ESD protection circuit in accordance with one embodiment of the present invention.

FIG. 2 illustrates a cross-sectional view of an ESD protection circuit 200 in accordance with one embodiment of the present invention. The ESD protection circuit 200 includes an NMOS transistor 202 constructed on a P-type well 204 in a P-type substrate 206. The NMOS transistor 202 includes a gate dielectric layer 208, a gate conductive layer 210, a heavily doped N+ source 212, and a heavily doped N+ drain 214. The gate conductive layer 210 is coupled to ground, or VSS, along with the heavily doped N+ source 212 and a heavily doped P+ well-contact 216. The heavily doped P+ well-contact 216 is separated from the heavily doped N+ source 212 by an isolation structure, such as shallow trench isolation (STI) region 218. A parasitic NPN bipolar transistor 220 is formed in the P-type well 204 where the heavily doped N+ drain 214 functions as the collector, the heavily doped N+ source 212 functions as the emitter, and the P-type well 204 functions as the base, which is connected to the heavily doped P+ well-contact 216.

It is noted that in another embodiment of the present invention, the gate conductive layer 210 can be coupled to a core circuit, instead of ground, for purposes such as layout efficiency.

An N-well resistor 222 is formed adjacent to the NMOS transistor. The N-well resistor 222 includes a stack of gate dielectric layer 224 and gate conductive layer 226 overlying the N-type well 223 between the heavily doped N+ drain 214 and a heavily doped N+ region 228. A contact 232 is formed on the N+ region 228 and is connected directly to a supply voltage, such as VDD. A buried P-type well 230 is formed beneath the N+ region 228, and adjacent to the N-type well 223. Note that it is optional for the gate conductive layer 226 to be connected to ground, source, drain, any supply voltage, or simply being floating. Also note that the N-Well resistor 222 can be a non-LDD structure for avoiding any surface current.

One or more sidewall spacers 234 are formed in both the NMOS transistor 202 and the N-well resistor 222. The sidewall spacers 234 are formed beside the gate dielectric layer 208 and the gate conductive layer 210 of the NMOS transistor 202. The sidewall spacers 234 are also formed beside the gate dielectric layer 224 and the gate conductive layer 226 of the N-well resistor 222. The sidewall spacers 234 protect the sides of the gate conductive layers 210 and 226, and the gate dielectric layers 208 and 224. One or more silicide layers 235 are optionally formed on top of the N+ regions 212, 214 and 228. Here, the gate dielectric layer 224, the gate conductive layer 226, and spacers 234 are collectively referred to as the first gate structure, while the gate dielectric layer 208, the gate conductive layer 210, and spacers 234 are collectively referred to as the second gate structure. It is noted that the silicide layers 235 are separated by the first and the second gate structures, so that they are not directly electrically connected to each other.

It is noteworthy that in another embodiment of the present invention, LDDs (not shown in the figure) can be formed adjacent to the N+ regions 214 and 228 under the spacers 234, as the LDDs of the NMOS transistor 202 are formed during the fabrication of the ESD protection circuit 200.

In a normal operation, the NMOS transistor 202 is turned off, so that it would not interfere the functioning of the core circuit it seeks to protect. During an ESD event, a positive ESD current would flow from the contact 232 through the N-well resistor 222 to trigger on the NMOS transistor 202 for dissipating the ESD current. When the ESD event generates a negative ESD current at the contact 232, the N+ region 228 and the buried P-type well 230 provide a current path for the negative ESD current to dissipate via the P-type substrate 206.

The process of fabricating the N-well resistor 222 can be fully integrated in the process of forming the NMOS transistor 202. The P-type wells 204 and 230 are formed in the substrate 206. The N-type well 223 adjacent to the P-type wells 204 and 230 is formed in the substrate 206. It is understood by those skilled in the art that the N-type well 223 can also be formed before the P-type wells 204 and 230. The gate dielectric layers 208 and 224 are formed on the P-type well 204 and the N-type well 223, respectively and simultaneously. The gate conductive layers 210 and 226 are formed on the gate dielectric layers 208 and 224, respectively and simultaneously. Spacers 234 are formed on sidewalls of the gate dielectric layers 208 and 224, and the gate conductive layers 210 and 226, simultaneously. The heavily doped N+ regions 212, 214 and 228 are formed simultaneously. Thereafter, silicide layers 235 can be optionally formed on the N+ regions 212, 214 and 228.

It is noted that the N+ regions 212, 214 and 228 are of the same polarity type as that of the N-type well 223, so that it can provide the N-well resistor 222 with resistance when passing the ESD current to the NMOS transistor 202.

It is also noted that in another embodiment of the present invention, one or more LDDs (not shown in the figure) adjacent to the N+ regions 212, 214 and in alignment with the gate dielectric layers 208 and 224 can be optionally implemented before the spacers 234 are formed.

One advantage of the present invention is that the architecture of the ESD protection circuit 200 as shown in FIG. 2 simplifies the fabrication process thereof. The presence of the gate structure configured by the gate dielectric layer 224, gate conductive layer 226 and spacers 234 protects the surface of the N-type well 223 from having a silicide layer formed thereon. The process of constructing the gate dielectric layer 224, the gate conductive layer 226 and the spacers 234 is essentially the same as that for constructing the gate dielectric layer 208, the gate conductive layer 210 and the spacers 234. Thus, no mask in addition to the ones for fabricating the NMOS transistor 202 is needed for constructing the N-well resistor 222. This helps to reduce the costs of fabricating the ESD protection circuit 200.

Another advantage of the present invention is that the N-well resistor 222 occupies less area than that occupied by the resistor made up by the N+ drain 116 as shown in FIG. 1 for the same amount of resistance. The N-type well 223 is formed by performing an ion implantation with a dosage lighter than that for the N+ regions 212, 214 and 228. Thus, the N-well resistor 222 is able to increase the resistance between the N+ regions 214 and 228, thereby rendering the N-well resistor 222 small in size.

Figure 3:
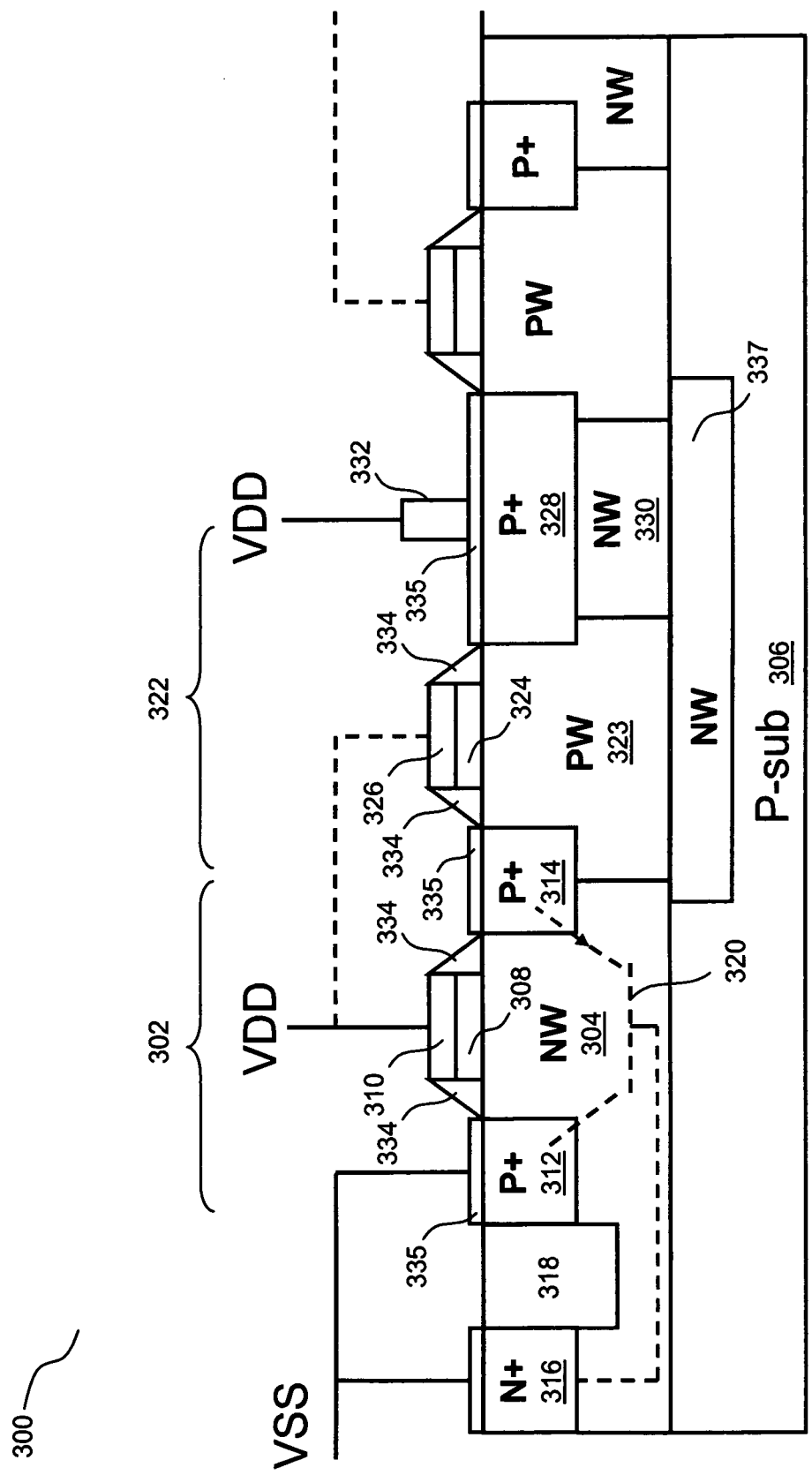
FIG. 3 illustrates a cross-sectional view of an ESD protection circuit in accordance with another embodiment of the present invention.

FIG. 3 illustrates a cross-sectional view of an ESD protection circuit 300 in accordance with another embodiment of the present invention. The ESD protection circuit 300 includes a PMOS transistor 302 constructed on an N-type well 304 in a P-type substrate 306. The PMOS transistor 302 includes a gate dielectric layer 308, a gate conductive layer 310, a heavily doped P+ source 314, and a heavily doped P+ drain 312. The gate conductive layer 310 is coupled to a drain, or VDD, along with the heavily doped P+ drain 312 and a heavily doped N+ well-contact 316. The heavily doped N+ well-contact 316 is separated from the heavily doped P+ drain 312 by an isolation structure, such as shallow trench isolation (STI) region 318. A parasitic PNP bipolar transistor 320 is formed in the N-type well 304 where the heavily doped P+ drain 312 functions as the collector, the heavily doped P+ source 314 functions as the emitter, and the N-type well 304 functions as the base, which is connected to the heavily doped N+ well-contact 316.

It is noted that in another embodiment, the gate conductive layer 310 can be coupled to a core circuit, instead of ground, for purposes such as layout efficiency. Also note that it is optional for the gate conductive layer 326 to be connected to ground, source, drain, any supply voltage, or simply being floating. Also note that the P-Well resistor 322 can be a non-LDD structure for avoiding any surface current.

A P-well resistor 322 is formed adjacent to the PMOS transistor 302. The P-well resistor 322 includes a stack of gate dielectric layer 324 and gate conductive layer 326 overlying the P-type well 323 between the heavily doped P+ source 314 and a heavily doped P+ region 328. A contact 332 is formed on the P+ region 328 and is connected directly to a supply source, such as VDD. A buried N-type well 330 is formed beneath the P+ region 228, and adjacent to the P-type well 323. An elongated buried N-type well 337 is formed beneath the buried N-type well 330, over the P-type well 323, and overlapping part of the N-type well 304.

One or more sidewall spacers 334 are formed in both the PMOS transistor 302 and the P-well resistor 322. The sidewall spacers 334 are formed beside the gate dielectric layer 308 and the gate conductive layer 310 of the PMOS transistor 302. The sidewall spacers 334 are also formed beside the gate dielectric layer 324 and the gate conductive layer 326 of the P-well resistor 322. The sidewall spacers 334 protect the sides of the gate conductive layers 310 and 326, and the gate dielectric layers 308 and 324. One or more silicide layers 335 are optionally formed on top of the P+ regions 312, 314 and 328. Here, the gate dielectric layer 324, the gate conductive layer 326, and spacers 334 are collectively referred to as the first gate structure, and the gate dielectric layer 308, the gate conductive layer 310, and spacers 334 are collectively referred to as the second gate structure. It is noted that the silicide layers 335 are separated by the first and the second gate structures, so that they are not directly electrically connected to each other.

It is noteworthy that in another embodiment of the present invention, LDDs (not shown in the figure) can be formed adjacent to the P+ regions 314 and 328 under the spacers 334, as the LDDs of the PMOS transistor 302 are formed during the fabrication of the ESD protection circuit 300.

The ESD protection circuit 300 functions similarly to the ESD protection circuit 200 shown in FIG. 2. The process of fabricating the P-well resistor 322 can also be fully integrated in the process of forming the PMOS transistor 302 as described above. As such, the ESD protection circuit 300 is simpler to fabricate and smaller in size as opposed to the conventional ESD protection circuit.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device comprising:
a first well formed on a substrate;
an electrostatic discharge (ESD) protection device formed on the first well;
a resistor well adjacent to the first well, the resistor well having a different polarity type as opposed to that of the first well;
a resistor having a gate structure formed on the resistor well separating a first doped region coupled to the ESD protection device and a second doped region coupled to a supply voltage for passing an ESD current from the second doped region to the first doped region to turn on the ESD protection device for dissipating the ESD current during an ESD event; and
a buried well formed beneath the second doped region and adjacent to the resistor well, wherein the resistor well has an impurity density lower than that of the first and second doped regions for increasing resistance therebetween,
wherein the ESD protection device is a MOS transistor having a gate and a source connected together to ground.

2. The semiconductor device of claim 1 wherein the gate structure comprises a stack of gate dielectric and gate conductive layers surrounded by spacers on their sides.

3. The semiconductor device of claim 1 wherein the resistor well, the first doped region and the second doped region are doped with P-type impurities.

4. The semiconductor device of claim 1 further comprising a first silicide layer on the first doped region and a second silicide layer on the second doped region, wherein the first and second silicide layers are separated by the gate structure.

5. The semiconductor device of claim 1 wherein the resistor well, the first doped region and the second doped region are doped with N-type impurities.

6. A semiconductor device comprising:
a first well formed on a substrate;
an ESD protection device formed on the first well; and
a resistor well adjacent to the first well, the resistor well having a different polarity type as opposed to that of the first well;
a resistor having a gate structure formed on the resistor well separating a first doped region coupled to the ESD protection device and a second doped region coupled to a supply voltage for passing an ESD current from the second doped region to the first doped region to turn on the ESD protection device for dissipating the ESD current during an ESD event;
a buried well formed beneath the second doped region and adjacent to the resistor well;
a first suicide layer on the first doped region; and
a second silicide layer on the second doped region, the first and second silicide layers being separated by the gate structure,
wherein the resistor well has an impurity density lower than that of the first and second doped regions for increasing resistance therebetween,
wherein the ESD protection device is a MOS transistor having a gate and a source connected together to ground.

7. The semiconductor device of claim 6 wherein the gate structure comprises a stack of gate dielectric and gate conductive layers surrounded by spacers on their sides.

8. The semiconductor device of claim 6 wherein the resistor well, the first doped region and the second doped region are doped with P-type impurities.

* * * * *